(12) United States Patent
Aruga et al.

(10) Patent No.: US 7,944,677 B2
(45) Date of Patent: May 17, 2011

(54) ELECTROSTATIC CHUCK

(75) Inventors: Yoshiki Aruga, Hachioji (JP); Eitarou Morimoto, Kunitachi (JP); You Tanaka, Fuchu (JP); Kazuaki Kaneko, Fuchu (JP)

(73) Assignee: Canon Anelva Corporation, Kawasaki-Shi, Kanagawa-Ken (JP)

( * ) Notice: Subject to any disclaimer, the term of this patent is extended or adjusted under 35 U.S.C. 154(b) by 0 days.

(21) Appl. No.: 12/666,748

(22) PCT Filed: Sep. 10, 2008

(86) PCT No.: PCT/JP2008/066340
§ 371 (c)(1),
(2), (4) Date: Dec. 24, 2009

(87) PCT Pub. No.: WO2009/035002
PCT Pub. Date: Mar. 19, 2009

(65) Prior Publication Data
US 2010/0284121 A1    Nov. 11, 2010

(30) Foreign Application Priority Data
Sep. 11, 2007   (JP) ................................ 2007-234968

(51) Int. Cl.
*H01T 23/00*    (2006.01)
(52) U.S. Cl. ....................................................... 361/234
(58) Field of Classification Search .................... 361/234
See application file for complete search history.

(56) References Cited

U.S. PATENT DOCUMENTS

| 5,825,607 | A | 10/1998 | Burkhart |
| 5,841,624 | A | 11/1998 | Xu et al. |
| 7,623,334 | B2 * | 11/2009 | Mizuno et al. ................ 361/234 |
| 7,663,860 | B2 | 2/2010 | Nishimoto et al. |
| 2004/0040665 | A1 | 3/2004 | Mizuno et al. |
| 2004/0114124 | A1 | 6/2004 | Hoeks et al. |
| 2006/0158823 | A1 | 7/2006 | Mizuno et al. |
| 2009/0283976 | A1 | 11/2009 | Kaneko |
| 2010/0024723 | A1 | 2/2010 | Hasegawa et al. |

FOREIGN PATENT DOCUMENTS

| CN | 1487360 A | 4/2004 |
| CN | 1624892 A | 6/2005 |
| JP | 5-198577 A | 8/1993 |

(Continued)

OTHER PUBLICATIONS

International Search Report for PCT/JP2008/066340 completed Dec. 2, 2008.

(Continued)

*Primary Examiner* — Stephen W Jackson
(74) *Attorney, Agent, or Firm* — Buchanan Ingersoll & Rooney PC

(57) ABSTRACT

An electrostatic chuck includes a dielectric board having an upper surface on which a plurality of projections for supporting a substrate on top surfaces and recesses surrounding the projections are formed, an electrode formed inside the dielectric board, and an external power supply which applies a voltage to the electrode. The dielectric board includes a conductor film formed on at least the top surface of each projection, and has a three-dimensional structure which causes the conductor film to generate a Johnson-Rahbeck force between the substrate and conductor film when a voltage is applied to the electrode.

14 Claims, 8 Drawing Sheets

FOREIGN PATENT DOCUMENTS

| | | |
|---|---|---|
| JP | 10-70180 A | 3/1998 |
| JP | 2002-503397 A | 1/2002 |
| JP | 2003-282688 A | 10/2003 |
| JP | 2004-22889 A | 1/2004 |
| JP | 2004-104114 A | 4/2004 |

OTHER PUBLICATIONS

Written Opinion for PCT/JP2008/066340 completed Dec. 2, 2008.
International Preliminary Report on Patentability for PCT/JP2008/066340 completed Mar. 4, 2009.
Iwanami Rikagaku Jiten, 3rd edition, enlarged edition, Iwanami Shoten, Publishers, Feb. 24, 1981, pp. 830.
U.S. Appl. No. 12/501,827, filed Jul. 13, 2009, available electronically.
U.S. Appl. No. 12/647,719, filed Dec. 28, 2009, by Y. Aruga et al., available electronically.
Chinese First Office Action dated Mar. 2, 2011 issued in the corresponding Chinese Patent Application No. 200880022898.5 and English language translation.

* cited by examiner

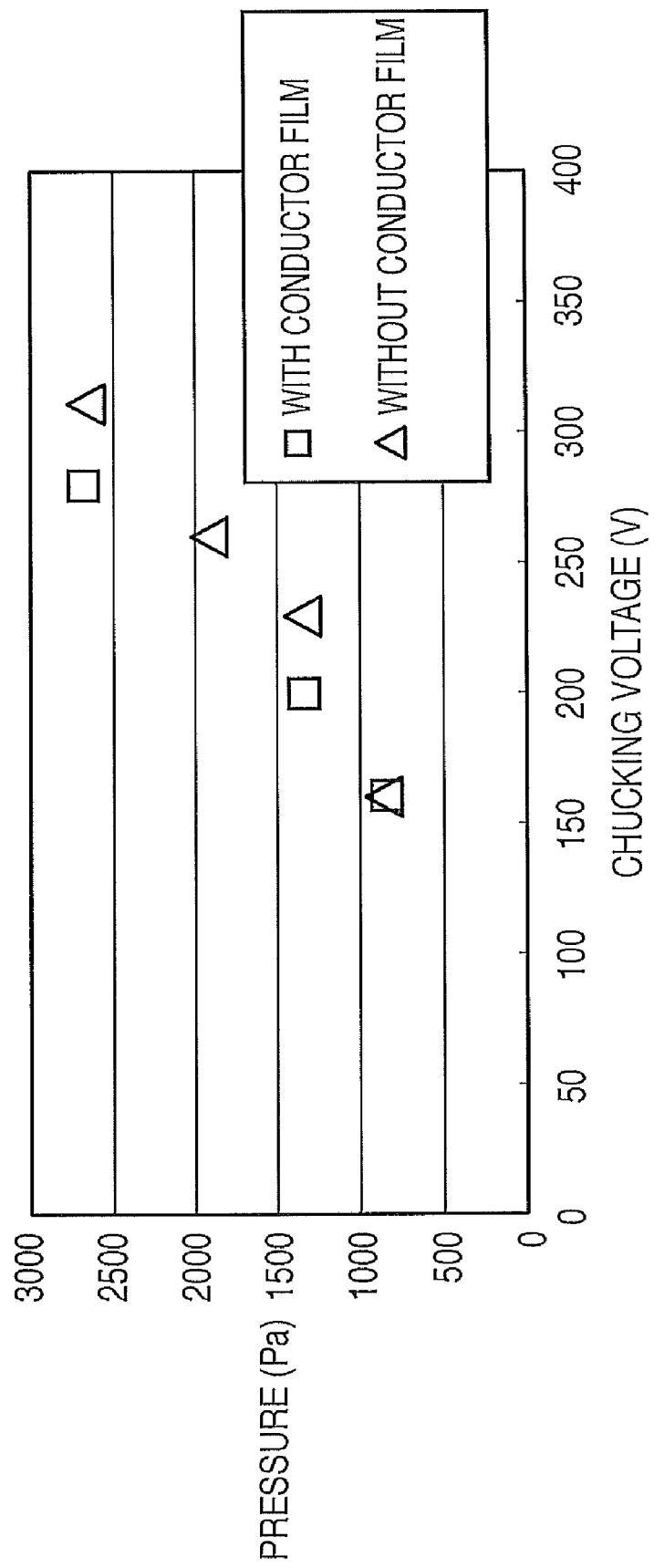

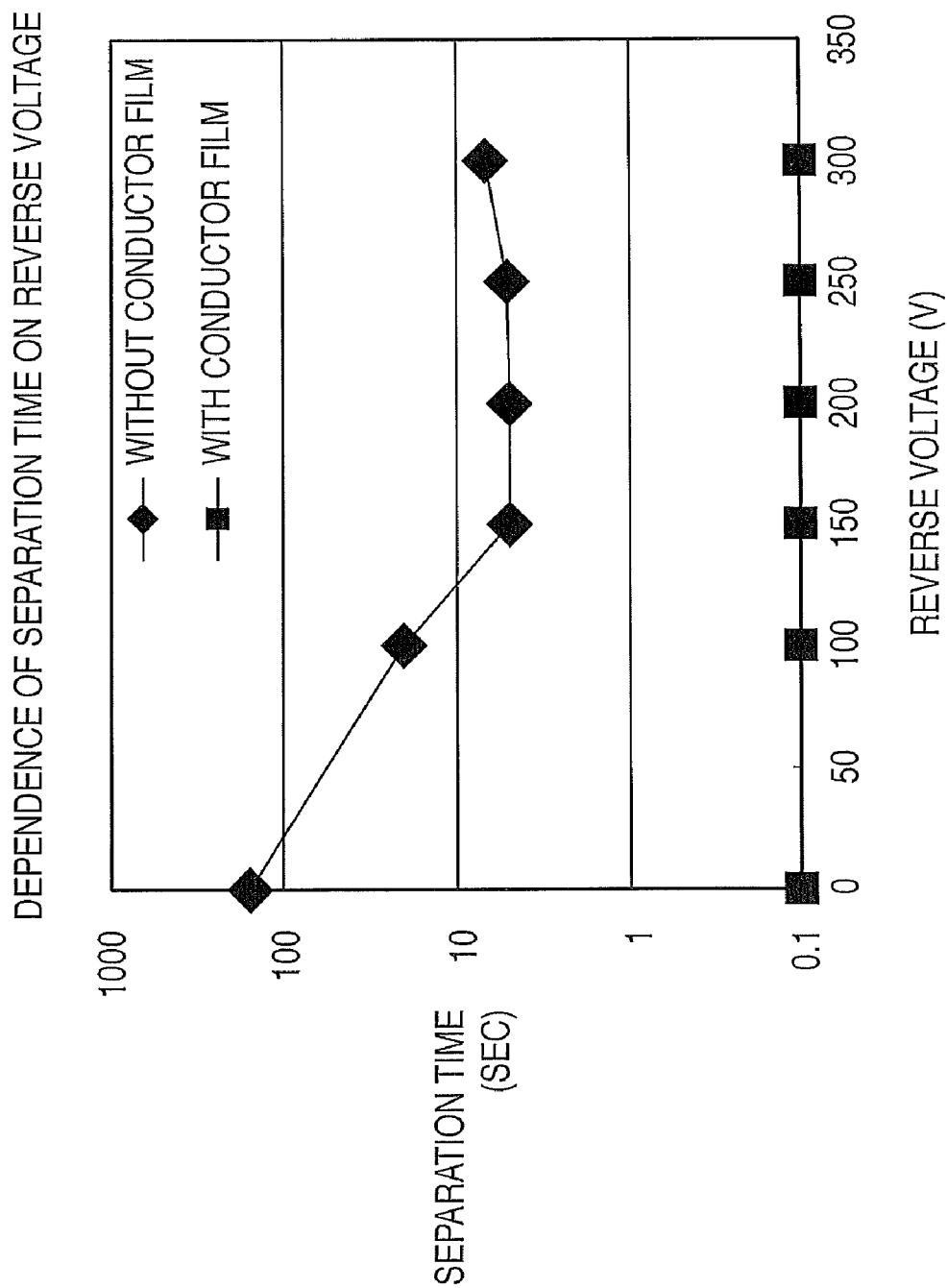

ELECTROSTATIC CHUCK

TECHNICAL FIELD

The present invention relates to an electrostatic chuck to be used to hold a substrate on a support member when processing the substrate in a semiconductor fabrication step or in an electronic part manufacturing step which manufactures a magnetic head or the like and has a step similar to the semiconductor fabrication step.

BACKGROUND ART

Conventionally, an electrostatic chuck disclosed in, for example, patent reference 1 is known as an electrostatic chuck. This electrostatic chuck includes a dielectric board having projections and recesses formed on the upper surface by embossing, an electrode formed inside the dielectric board, and an external power supply for applying a voltage to the electrode. Also, the top surface (substrate supporting surface) of each projection is covered with a conductor line. This conductor line electrically connects the substrate supporting surfaces of the projections, and the electrostatic chuck has a switch for grounding or floating the conductor line. Furthermore, those portions of the electrode which are close to the individual projections are removed in one-to-one correspondence with the projections.

The above-mentioned electrostatic chuck has as its main purpose to prevent the generation of particles by friction between a substrate and the projections, and prevents the electrostatic chucking force from acting between the substrate supporting surfaces of the projections and a substrate. That is, when holding a substrate by applying a voltage to the electrode, the substrate supporting surface of each projection and the lower surface of the substrate in contact with the substrate supporting surface are set at the same potential by moving electric charge through the conductor line, thereby preventing the Johnson-Rahbeck force from acting between them (see paragraph [0022] of patent reference 1). The substrate is held by the spatial Coulomb force between the recesses of the upper surface of the dielectric board and the lower surface of the substrate (see paragraph [0040] of patent reference 1). Also, when unloading the substrate, the substrate can be separated by rapidly moving electric charge by grounding the conductor line (see paragraph of patent reference 1).

Furthermore, in an electrostatic chuck disclosed in patent reference 2, an arrangement in which a separation mask has an insulating material such as diamond and a mask made of a metal such as titanium or titanium nitride is disclosed.
Patent reference 1: Japanese Patent Laid-Open No. 2004-22889
Patent reference 2: Japanese Patent Laid-Open No. 10-70180

DISCLOSURE OF INVENTION

Problems that the Invention is to Solve

In patent reference 1, however, the Johnson-Rahbeck force acting between the substrate supporting surface of each projection and the lower surface of a substrate in contact with the substrate supporting surface is a very large chucking force. Therefore, the chucking force is often insufficient in a conventional electrostatic chuck in which no Johnson-Rahbeck force acts. This problem can be solved by allowing the Johnson-Rahbeck force to act by removing the conductor line covering the substrate supporting surfaces of the projections.

When removing the conductor line covering the substrate supporting surfaces of the projections, however, electric charge cannot rapidly be moved any longer by grounding the conductor line by the switch. Consequently, the residual electric charge delays the time at which the substrate can be separated. In addition, to remove electric charge when unloading a substrate, the conventional electrostatic chuck must have a special wiring structure in which the conductor line covering and electrically connecting the substrate supporting surfaces of the projections is formed and connected to the switch. This complicates the structure.

Also, when a material different from the material of the electrostatic chuck is used as the insulating material as disclosed in patent reference 2, electric charge on the lower surface of a substrate is trapped, and as a consequence the residual chucking force remains on the substrate. This makes the separation of the substrate from the electrostatic chuck unstable.

Means of Solving the Problems

The present invention has been made in consideration of the above conventional problems, and has as its object to obtain a sufficient electrostatic chucking force and achieve rapid unloading of a substrate from an electrostatic chuck (improve the stability of substrate separation) by a simple structure.

An electrostatic chuck according to the present invention which achieves the above object is comprises a dielectric board having an upper surface on which a plurality of projections for supporting a substrate on top surfaces and recesses surrounding the projections are formed, an electrode formed inside the dielectric board and receives a voltage from an external power supply, wherein the dielectric board includes a conductor film formed on at least the top surface of each projection, and the top surfaces of the projections each having the conductor film have a three-dimensional structure whose Ry (maximum surface roughness) is not more than 2.5 µm and Ra (central line average roughness) is not more than 0.25 µm.

EFFECTS OF THE INVENTION

A gap is formed between the recess around the projection on the upper surface of the dielectric board and the lower surface of a substrate. Therefore, when different electric charges are stored on the upper surface of the dielectric board and the lower surface of the substrate by applying a voltage to the electrode, the spatial Coulomb force acts between the recess of the upper surface of the dielectric board and the lower surface of the substrate. Also, the same electric charge as that on the upper surface of the dielectric board is stored on the upper surface of the conductor film. Between the conductor film on the top surface of the projection and the lower surface of the substrate, fine three-dimensional structures of the top surfaces microscopically form contact points and a fine gap. Accordingly, the Johnson-Rahbeck force acts in this fine gap between the conductor film and substrate. That is, in the present invention, the substrate is chucked by both the spatial Coulomb force acting between the recess of the upper surface of the dielectric board and the lower surface of the substrate, and the Johnson-Rahbeck force acting between the conductor film on the projection of the upper surface of the dielectric board and the lower surface of the substrate. As a consequence, a sufficient substrate holding force is obtained in the present invention.

On the other hand, when the voltage application to the electrode is stopped, the lower surface of the substrate and the conductor films on the top surfaces of the plurality of projections are going to have the same potential via the contact points between the conductor films and the lower surface of the substrate, thereby removing electric charge. This makes it possible to eliminate the residual chucking force on the substrate, and rapidly unload the substrate after the voltage application to the electrode is stopped. To enable rapid charge removal, it is advantageous to increase the number of contact points between the substrate and conductor films, and the conductor films are preferably as smooth as possible. Even when the conductor films are smoothened, the gap between the conductor films and the lower surface of the substrate does not microscopically disappear, but the width of the gap further decreases, and the Johnson-Rahbeck force acting in this gap increases.

Furthermore, the generation of particles can be suppressed by selecting a film having a high wear resistance as the conductor film.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 6 is a graph showing the states of the supporting force (chucking force) when the conductor film is formed and not formed;

FIG. 8 is a graph showing the results of measurements of times before a substrate can be separated by applying a reverse voltage to the electrostatic chuck for a predetermined time immediately before an external power supply is turned off.

BEST MODE FOR CARRYING OUT THE INVENTION

Embodiments of the present invention will be explained in detail below. However, constituent elements described in the embodiments are merely examples, and the technical scope of the present invention is determined by the scope of the appended claims and is not limited by the following individual embodiments.

An electrostatic chuck of the present invention will be explained below by taking a case in which the electrostatic chuck is applied to a sputtering apparatus as an example.

Figure 1:
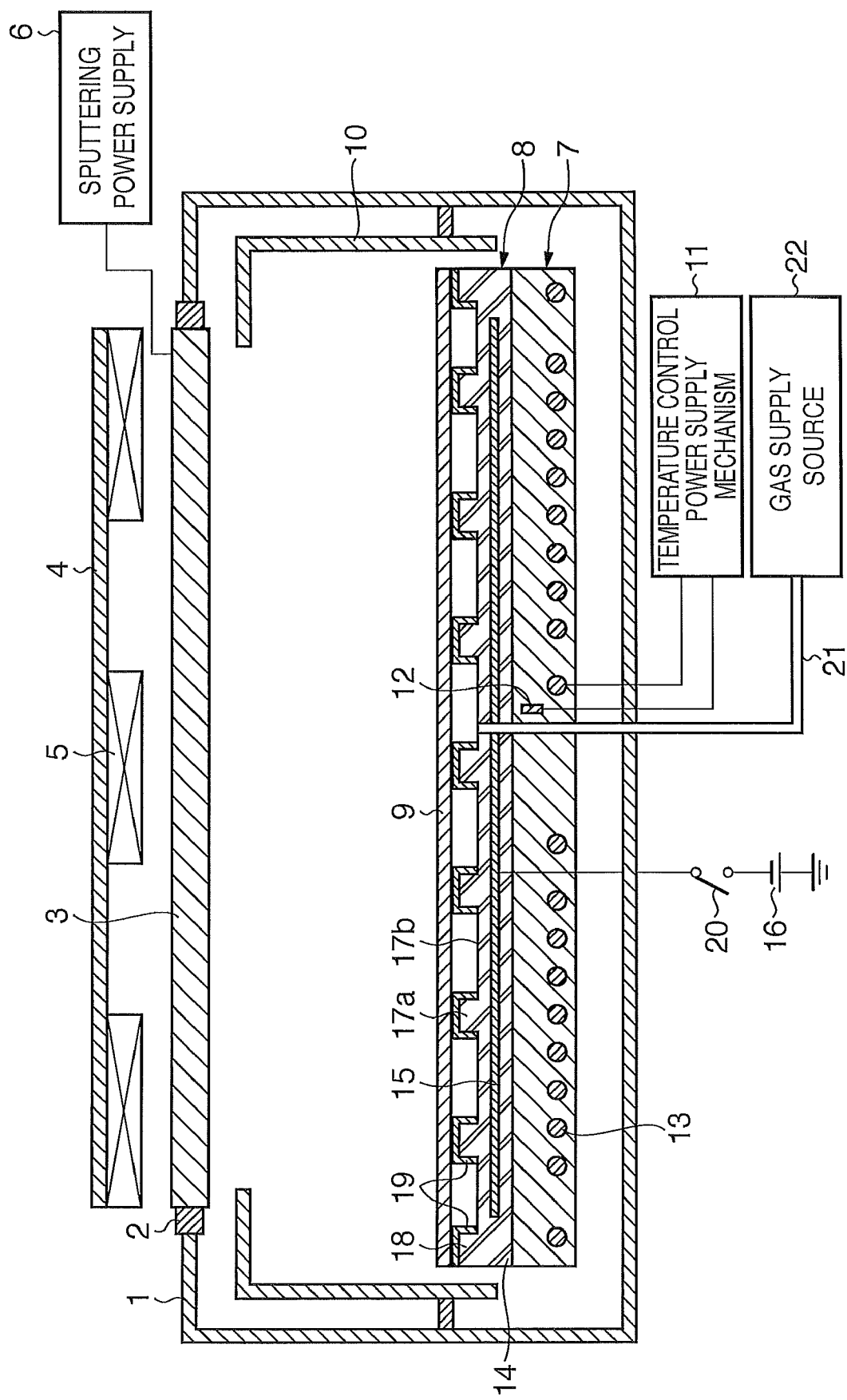
FIG. 1 is an exemplary sectional view of a sputtering apparatus including an electrostatic chuck according to an embodiment of the present invention.
Figure 2:
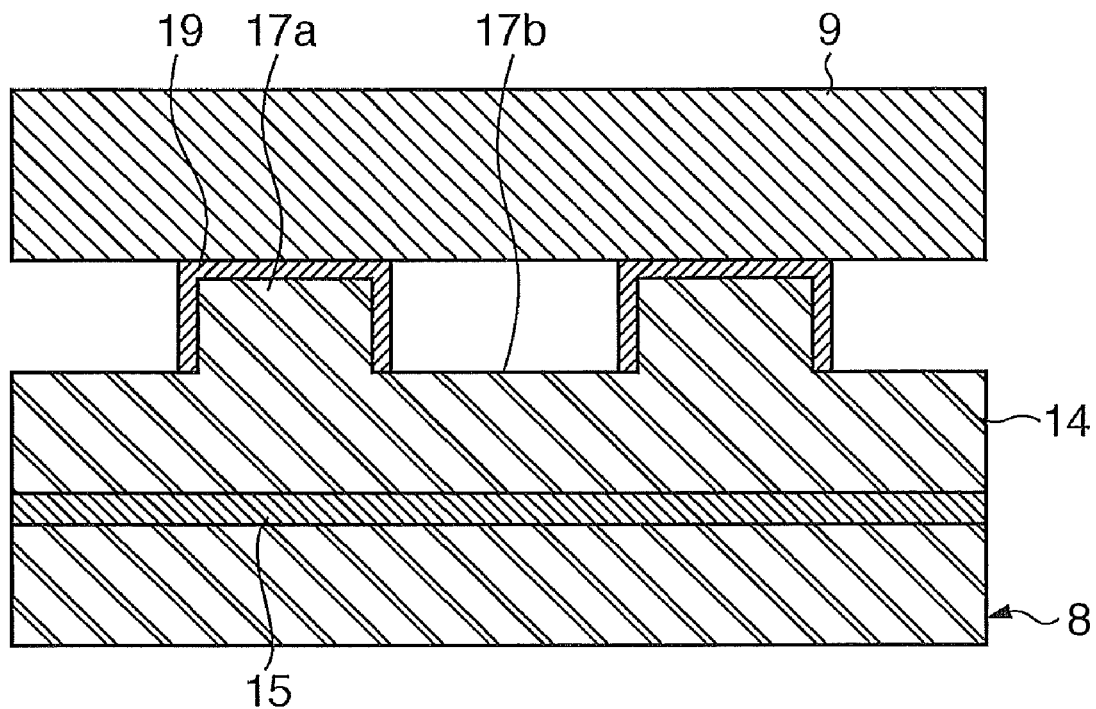
FIG. 2 is a partially enlarged exemplary sectional view of the electrostatic chuck according to the embodiment of the present invention.
Figure 3:
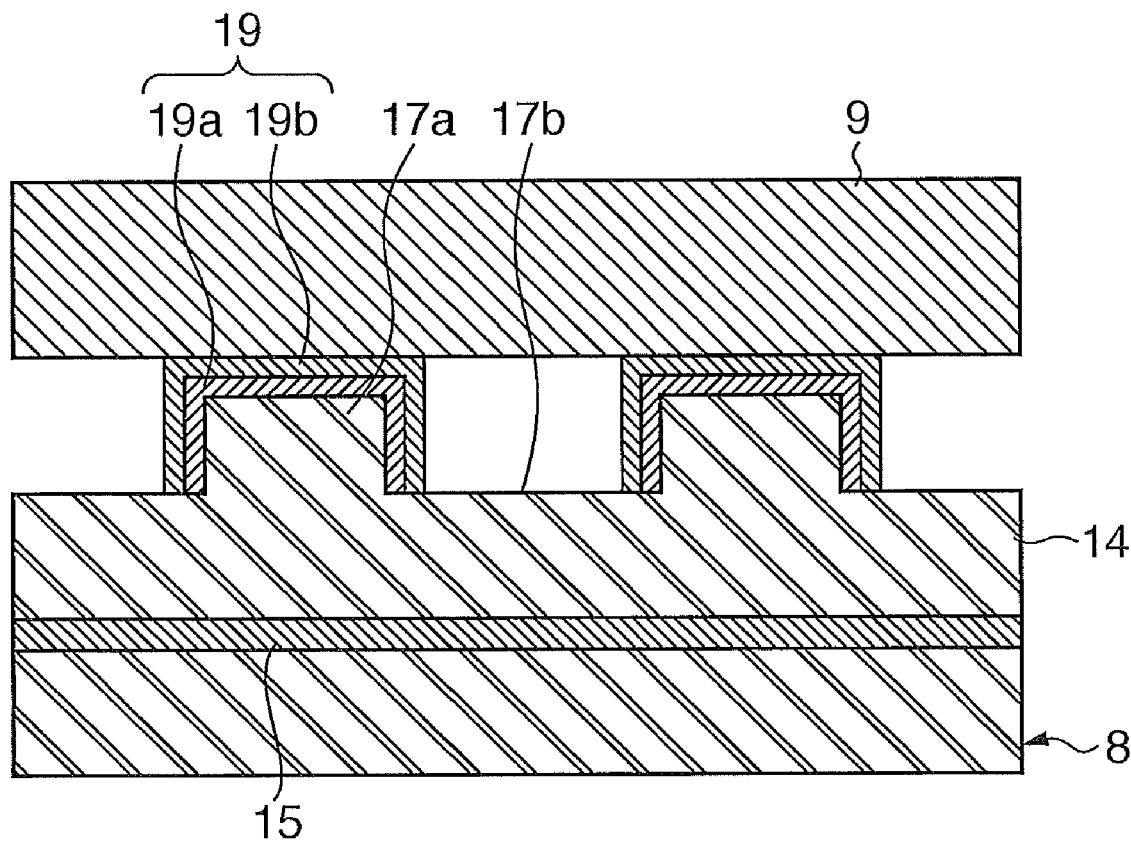
FIG. 3 is a partially enlarged exemplary sectional view of an electrostatic chuck according to another embodiment of the present invention.
Figure 4A:
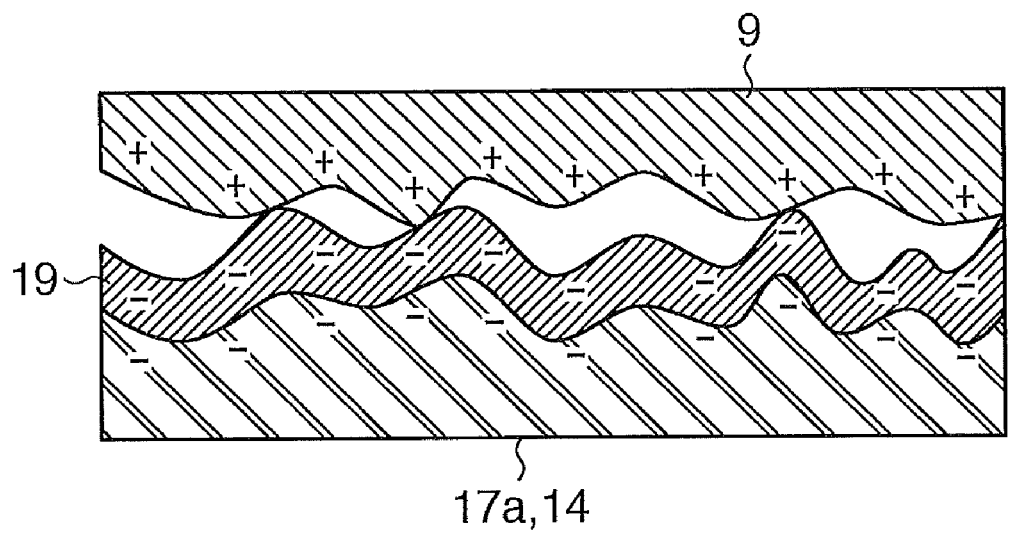
FIG. 4A is a view showing the states of electric charge on the upper surface of a conductor film of the electrostatic chuck shown in FIG. 2 and the lower surface of a substrate when it is chucked.
Figure 4B:
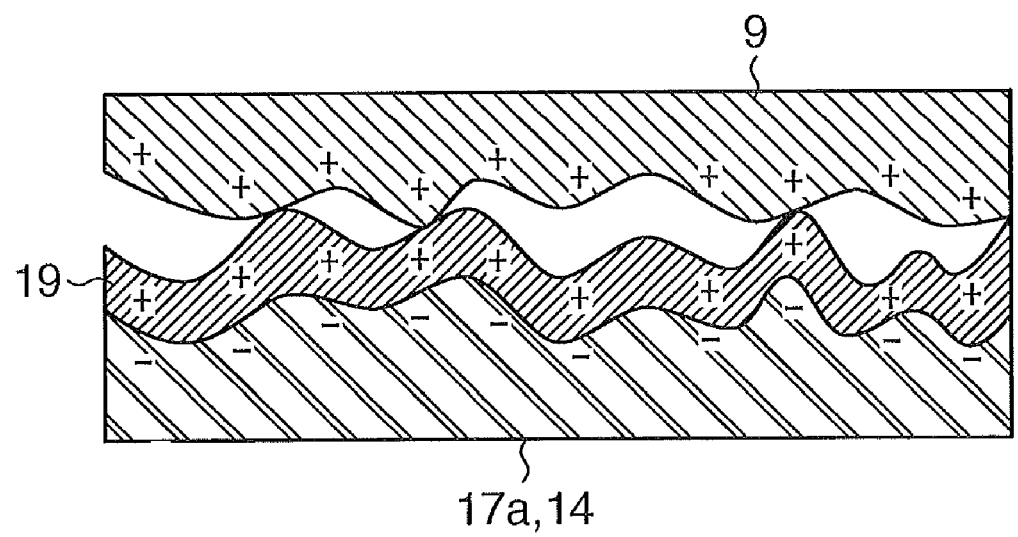
FIG. 4B is a view showing the states of electric charge on the upper surface of the conductor film of the electrostatic chuck shown in FIG. 2 and the lower surface of a substrate when it is separated.
Figure 5A:
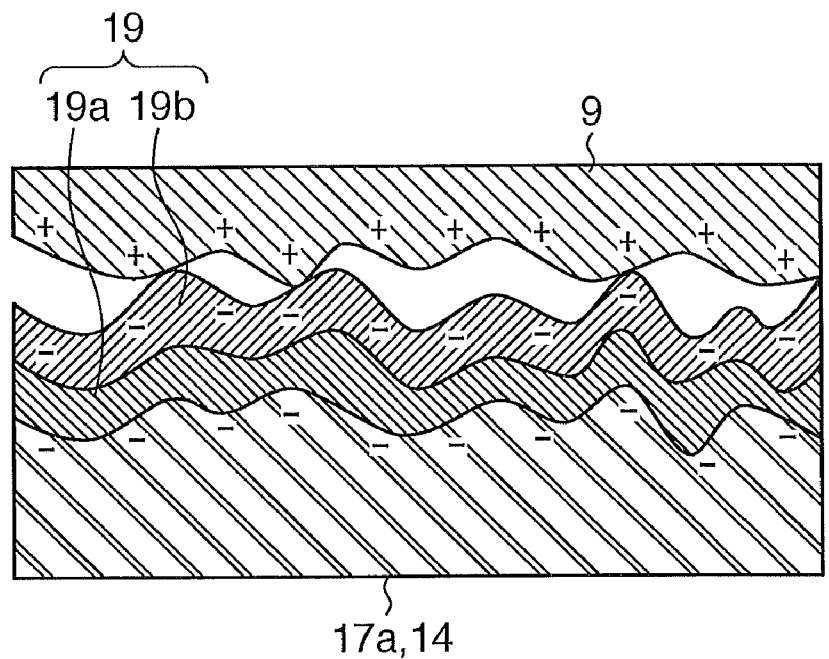
FIG. 5A is a view showing the states of electric charge on the upper surface of a conductor film of the electrostatic chuck shown in FIG. 3 and the lower surface of a substrate when it is chucked.
Figure 5B:
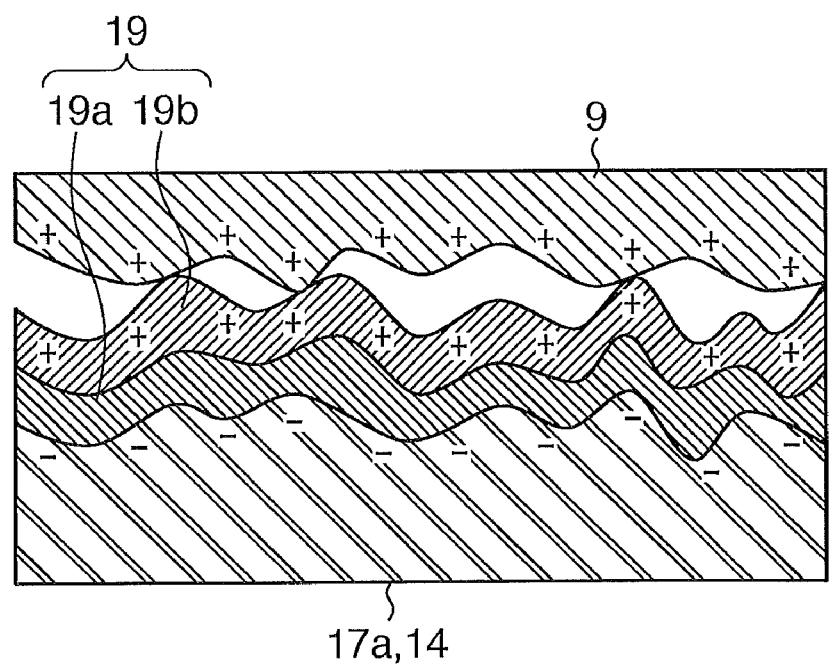
FIG. 5B is a view showing the states of electric charge on the upper surface of the conductor film of the electrostatic chuck shown in FIG. 3 and the lower surface of a substrate when it is separated.

FIG. 1 is an exemplary sectional view of a sputtering apparatus including an electrostatic chuck according to an embodiment of the present invention. FIG. 2 is a partially enlarged exemplary sectional view of the electrostatic chuck according to the embodiment of the present invention. FIG. 3 is a partially enlarged exemplary sectional view of an electrostatic chuck according to another embodiment of the present invention. FIG. 4A is a view showing the states of electric charge on the upper surface of a conductor film of the electrostatic chuck shown in FIG. 2 and the lower surface of a substrate when it is chucked. FIG. 4B is a view showing the states of electric charge on the upper surface of the conductor film of the electrostatic chuck shown in FIG. 2 and the lower surface of a substrate when it is separated. FIG. 5A is a view showing the states of electric charge on the upper surface of a conductor film of the electrostatic chuck shown in FIG. 3 and the lower surface of a substrate when it is chucked. FIG. 5B is a view showing the states of electric charge on the upper surface of the conductor film of the electrostatic chuck shown in FIG. 3 and the lower surface of a substrate when it is separated.

First, an outline of the sputtering apparatus will be explained with reference to FIG. 1. The sputtering apparatus shown in FIG. 1 includes a vessel 1 that can be evacuated by an external evacuating mechanism (not shown), and a target 3 attached to the ceiling of the vessel 1 with a ring-like insulating member 2 interposed between them. Magnets 5 fixed on a yoke plate 4 are arranged to face the lower surface of the target 3. Also, a sputtering power supply 6 for applying a voltage is connected to the target 3.

In a position opposite to the target 3, an electrostatic chuck 8 is installed on a substrate temperature adjusting unit 7 fixed to the bottom of the vessel 1, and a substrate 9 is placed on the electrostatic chuck 8. In addition, a cylindrical shielding member 10 is formed along the inner surface of the circumferential wall of the vessel 1 between the target 3 and electrostatic chuck 8.

The substrate temperature adjusting unit 7 is a member that controls the temperature of the substrate 9 via the electrostatic chuck 8, and includes a thermocouple 12 and heating/cooling portions 13 connected to a temperature control power supply mechanism 11. In the substrate temperature adjusting unit 7, the temperature control power supply mechanism 11 operates the heating/cooling portions 13 based on a temperature detected by the thermocouple 12, thereby heating or cooling the electrostatic chuck 8.

The electrostatic chuck 8 installed on the substrate temperature adjusting unit 7 includes a dielectric board 14 having an embossed surface (upper surface), an electrode 15 formed inside the dielectric board 14, and an external power supply 16 for applying a predetermined voltage to the electrode 15.

The upper surface of the dielectric board 14 has a plurality of projections 17a and surrounding recesses 17b formed by embossing. On the edge of the upper surface of the dielectric board 14, an outer periphery protruding portion 18 is formed to surround the region where the projections 17a and recesses 17b are formed. The projections 17a and outer periphery protruding portion 18 have top surfaces on which the substrate 9 is placed, and have almost the same height.

A conductor film 19 is formed to cover at least the top surface of each projection 17a, except for the recesses 17b. Each conductor film 19 has a three-dimensional structure that generates the Johnson-Rahbeck force between the substrate 9 and conductor film 19 when a voltage is applied to the electrode 15 (to be described later). This three-dimensional structure functions as a Johnson-Rahbeck force generating portion. Each conductor film 19 may cover not only the top surface of the projection 17a but also its circumferential surface. However, each conductor film 19 is not formed in the recess 17b and is electrically isolated from other conductor films 19.

In the example shown in FIG. 1, the conductor film 19 is formed on the top surface of the outer periphery protruding portion 18 as well. The conductor film 19 on the outer periphery protruding portion 18 is preferably formed to facilitate equalizing the overall heights of the outer periphery protruding portion 18 and projections 17a, but may also be omitted.

The electrode 15 is a monopolar electrode and connected to the external power supply 16 as a DC power supply via a switch 20. A predetermined negative voltage is applied to the electrode 15 by turning on the switch 20. Although the electrode 15 shown in FIG. 1 is a monopolar electrode, it is also possible to form bipolar electrodes on the inner and outer peripheries of the dielectric board 14, and apply a negative voltage to one electrode and a positive voltage to the other. Furthermore, the electrode 15 has a diameter smaller than that of the outer periphery protruding portion 18. Therefore, the electrode 15 exists only below the region where the projections 17a and recesses 17b are formed, and does not exist near the portion immediately below the outer periphery protruding portion 18. Since the electrode 15 does not exist below the outer periphery protruding portion 18, the outer periphery protruding portion 18 does not contribute to chucking of the substrate 9.

As described previously, the substrate 9 is placed on the top surfaces of the projections 17a and outer periphery protruding portion 18. Between the substrate 9 and dielectric board 14, therefore, the recesses 17b form a gap in the region surrounded by the outer periphery protruding portion 18. A gas supply source 22 is connected to this gap via a gas supply path 21, so a gas (e.g., argon gas) can be supplied to the gap. By thus supplying the gas to the gap, it is possible to conduct the heat of the substrate temperature adjusting unit 7 to the substrate 9 by thermal conduction of the electrostatic chuck 8 and the gas in the gap, thereby maintaining the substrate 9 at a predetermined temperature.

The electrostatic chuck 8 will be explained in more detail below with reference to FIGS. 1 to 3. The projection 17a is normally a column and preferably has a diameter of 0.7 mm or less. The lower limit is determined by, for example, the necessary mechanical strength of the projection 17a and the limitations on processing, and generally about 0.3 mm. If the diameter of the projection 17a increases, it becomes difficult to rapidly remove electric charge when separating the substrate 9. This is so presumably because many contact points between the substrate 9 and the conductor films 19 formed on the top surfaces of the projections 17a achieve rapid charge removal, although details are unknown. When the diameter of the projection 17a is small, the maximum surface roughness (Ry) of the microscopic three-dimensional structure, which functions as a Johnson-Rahbeck force generating portion, of the top surface of the projection 17a decreases from the viewpoint of probability, and the upper surface smoothness of the conductor film 19 increases. This perhaps increases the number of contact points between the substrate 9 and conductor film 19. When the smoothness of the conductor film 19 increases, the width of the gap formed by the microscopic three-dimensional structure, which functions as a Johnson-Rahbeck force generating portion, of the top surface of the projection 17a decreases, and the Johnson-Rahbeck force acting between the substrate 9 and conductor film 19 increases.

To obtain favorable chucking and separating actions, the top surface of the projection 17a preferably has a smooth surface, and preferably has an Ry (maximum surface roughness) of 2.5 µm or less and an Ra (central line average roughness) of 0.25 µm or less. Since it is practically impossible to form a completely smooth surface, the lower limit is not particularly restricted. From the viewpoint of a practical smoothing limit, however, the Ry is 0.2 µm or more, and the Ra is 0.02 µm or more.

The height of the projections 17a and outer periphery protruding portion 18 is preferably 15 µm or less, provided that the chucked substrate 9 is not in contact with the recesses 17b. The Coulomb force acting between the substrate 9 and recesses 17b can be increased by decreasing the height of the projections 17a and outer periphery protruding portion 18. The lower limit of the height is generally about 6.5 µm.

To obtain an appropriate chucking force and achieve rapid charge removable, the projections 17a are preferably formed such that the total area of the top surfaces of the projections 17a is 1% to 2% of the overall planar area of the dielectric board 14.

The conductor film 19 is made of, for example, a metal, metal oxide, or metal nitride as an electrical conductor having a resistivity of $10\ E^{-4}$ µΩ·cm or less, and the resistivity is preferably 400 µΩ·cm or less, and particularly preferably, 350 µΩ·cm or less. The electrostatic chuck according to this embodiment is formed as a bulk (plate). Therefore, it is unnecessary to use any dissimilar insulating material unlike in the separation mask of patent reference 2 described earlier. The material of the electrostatic chuck has a volume resistivity capable of achieving a Johnson-Rahbeck force of $E+8$ to $E+10$ Ω·cm. It is normally possible to maintain a predetermined chucking force by the Johnson-Rahbeck force and spatial Coulomb force without any conductor film on the upper surface of an electrostatic chuck (back side pressure=30 to 50 torr). The conductor film stores the same electric charge as that on the dielectric surface of the electrostatic chuck, and secures the chucking force when there is no conductor film. In addition, during substrate separation in which a substrate is unloaded from the electrostatic chuck, the residual chucking force of the substrate is eliminated by setting the substrate lower surface and conductor film at the same potential. By thus eliminating the residual chucking force of the substrate, it is possible to smoothly unload the substrate from the electrostatic chuck, that is, increase the stability of substrate separation.

Setting the resistivity of the conductor film at, for example, 350 µΩ·cm or less facilitates setting the lower surface of the substrate and the conductor film on the upper surface of the electrostatic chuck at the same potential. Consequently, it is possible to eliminate the residual chucking force of the substrate from which electric charge is removed, and smoothly unload (separate) the substrate from the electrostatic chuck.

By contrast, if the resistivity is high, the electric charge on the substrate lower surface is trapped, and as a consequence the residual chucking force remains on the substrate. This makes separation of the substrate from the electrostatic chuck unstable.

Examples of the material of the conductor film 19 are metals such as titanium and tungsten, and oxides or nitrides of these metals. Materials such as titanium and tungsten are strong against thermal strain among other metals, and hardly deform because they have high wear resistances. Accordingly, these materials can suppress particles generated by, for example, contact between a substrate and the conductor film of the electrostatic chuck, or friction caused by a linear expansion difference, and increase the wear resistance.

The conductor film 19 can be a single-layered film as shown in FIG. 2, and can also be a multi-layered film (a first layer 19a and second layer 19b) as shown in FIG. 3. When depositing the multilayered film (the first layer 19a and second layer 19b) as shown in FIG. 3, the first layer 19a as an inside layer is preferably made of a metal such as titanium or tungsten, and the second layer 19b formed on the first layer 19a is preferably made of an oxide or nitride of a metal such as titanium or tungsten. By using a metal oxide or metal nitride having a high wear resistance as the second layer 19b, it is possible to suppress the generation of particles when the substrate 9 is loaded and unloaded, and increase the wear resistance.

The conductor film 19 can be formed by a film formation method such as sputtering or ion plating. The thickness of the conductor film 19 is preferably 1.5 µm or less in order to decrease the resistance of the conductor film 19 in the film thickness direction to about 10Ω. If the thickness of the conductor film 19 exceeds 1.5 µm, the resistance of the conductor film increases, and film pealing readily occurs owing to the film stress. A practical lower limit is about 0.5 µm.

The conductor film 19 need only be formed on at least the top surface of the projection 17a except for the recesses 17b, but can also be formed to the circumferential surface of the projection 17a as described previously. When the conductor film 19 is formed to the circumferential surface, the deposition state can be stabilized. The conductor film 19 may also be formed on the top surface and side surfaces of the outer periphery protruding portion 18.

Note that FIG. 1 shows none of a substrate transfer robot, a loading/unloading gate, lift pins for loading and unloading the substrate 9 onto and from the electrostatic chuck 8, a mechanism related to discharge, a discharge gas supply mechanism, and the like.

In the sputtering apparatus shown in FIG. 1, the substrate transfer robot loads the substrate 9 from the loading/unloading gate onto the electrostatic chuck 8 in the vessel 1. When the vessel 1 is set in a predetermined vacuum ambient and a voltage is applied to the electrode 15 by turning on the switch 20, different electric charges are stored on the upper surfaces of the dielectric board 14 and conductor films 19 and the lower surface of the substrate 9. FIGS. 4A and 5A illustrate the states of electric charge on the upper surface of the conductor film 19 and the lower surface of the substrate 9 when the switch 20 is turned on. In these states, the spatial Coulomb force acts between the recesses 17b of the upper surface of the dielectric board 14 and the lower surface of the substrate 9, and the Johnson-Rahbeck force acts in a fine gap between the conductor films 19 on the top surfaces of the projections 17a and the lower surface of the substrate 9. The substrate 9 is strongly chucked to the electrostatic chuck by the spatial Coulomb force and Johnson-Rahbeck force.

After the substrate 9 is chucked to the electrostatic chuck 8, the gas supply source 22 supplies a necessary amount of gas to the gap between the electrostatic chuck 8 and substrate 9. At the same time, the temperature control power supply mechanism 11 operates the heating/cooling portions 13 to hold the temperature of the substrate 9 constant, a discharge gas is supplied into the vessel 1, and sputtering is performed by turning on the sputtering power supply 6.

When this sputtering is complete, the sputtering power supply 6 is turned off, and the voltage application to the electrode 15 is stopped by turning off the switch 20. Consequently, the lower surface of the substrate 9 and the conductor films 19 on the top surfaces of the plurality of projections 17a are going to have the same potential through the contact points between the conductor films 19 and the lower surface of the substrate 9, thereby removing electric charge. Accordingly, the substrate 9 can be rapidly unloaded after the voltage application to the electrode 15 is stopped. FIGS. 4B and 5B illustrate the states of electric charge on the upper surface of the conductor film 19 and the lower surface of the substrate 9 when the switch 20 is turned off.

By the charge removing action described above, the substrate 9 can be unloaded from the electrostatic chuck 8 within a short time after the switch 20 is turned off. The substrate transfer robot carries the unloaded substrate 9 outside the vessel 1 from the loading/unloading gate.

Next, a more practical embodiment of the electrostatic chuck will be explained.

In this embodiment, 384 columnar projections 17a having a diameter of 0.4 mm±0.15 mm and a height of 8.5 µm±2 µm and the outer periphery protruding portion 18 having the same height as that of the projections 17a and a width of 1 mm±0.3 mm were formed on the upper surface of the dielectric board 14 of the electrostatic chuck 8 in order to hold a 300-mm substrate 9 (silicon wafer). The total area of the top surfaces of the projections 17a was set at 1.5% of the overall planar area of the dielectric board 14.

In this embodiment, the electrode 15 of the electrostatic chuck 8 was not placed immediately below the outer periphery protruding portion 18 in order to obtain an appropriate holding force.

The Ry and Ra of the top surface of each projection 17a were respectively adjusted to 2.5 µm or less and 0.25 µm or less.

Titanium films and titanium nitride films were sequentially formed as the conductor films 19 near only the top surfaces of the projections 17a and outer periphery protruding portion 18. The thickness of the titanium film was 1.0 µm, and that of the titanium nitride film was 0.3 µm.

Practical results of the above embodiment will be explained below with reference to a graph shown in FIG. 6.

The states of the supporting force (chucking force) when the conductor films 19 are formed on the top surfaces of the projections 17a and outer periphery protruding portion 18 and no conductor films 19 are formed will be explained below with reference to FIG. 6. A graph shown in FIG. 6 indicates the relationship between the voltage applied to the electrode 15 of the electrostatic chuck 8 of the sputtering apparatus as shown in FIG. 1, that is, the chucking voltage (V), and the pressure (Pa) of a gas (argon gas) sealed between the electrostatic chuck 8 and substrate 9, that is, the chucking force. The substrate 9 is a 300-mm silicon substrate covered with silicon nitride.

FIG. 6 reveals that almost identical supporting forces can be obtained with and without the conductor films 19. A larger supporting force is obtained with the conductor films 19 in some measurement points. The supporting force is inversely proportional to the square of the distance between the electrostatic chuck 8 and substrate 9. In this embodiment, a 1.3-µm thick conductor film 19 was formed on the top surface of the projection 17a having a height of 8.5 µm, and the distance was 9.8 µm. Therefore, a supporting force (obtained by the spatial Coulomb force) F of the recess 17b of the electrostatic chuck 8 presumably decreases from $1.59 E^2$ (N) to $1.19 E^2$ (N) on calculation.

This experimental result will be described below with reference to a graph shown in FIG. 7.

Figure 7:
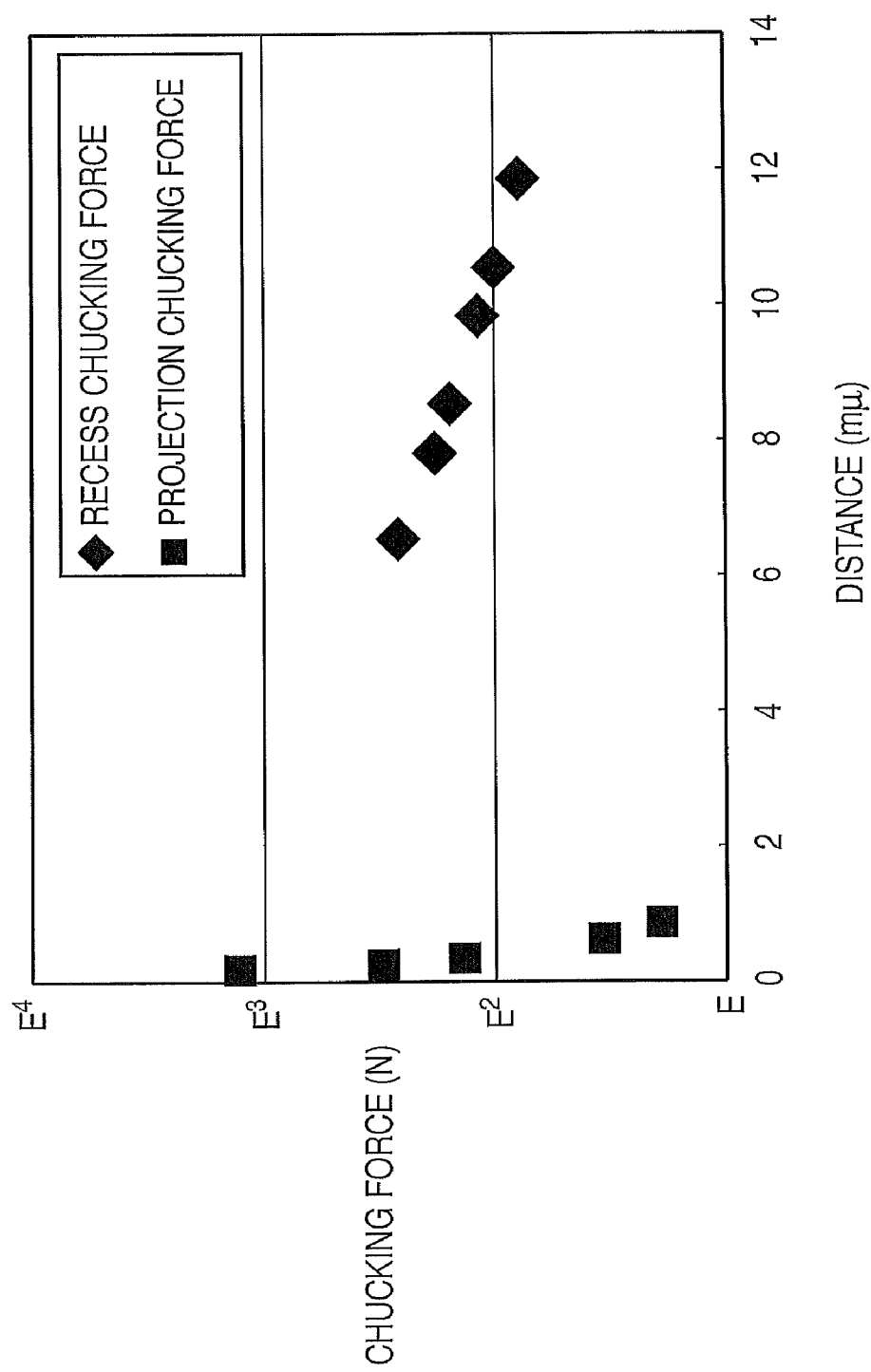
FIG. 7 is a graph plotting the results of calculations of the chucking forces of a projection and recess in the electrostatic chuck based on this embodiment.

FIG. 7 is a graph plotting the results of calculations of the chucking forces of the projection 17a and recess 17b of the electrostatic chuck 8 based on this embodiment. The comparison of the chucking forces of the projection 17a and recess 17b demonstrates that the chucking force of the projection 17a abruptly increases when the distance, that is, the microscopically formed gap decreases. Note that the chucking force (F) is a value obtained from $F=E(V^2/L^2)A/2$ (E=dielectric constant of gap, V=voltage, L=gap (distance), and A=electrode area), and the unit is Newton (N).

As already explained, the upper surface roughness of the projection 17a has a large influence on the chucking force of the projection 17a. This result indicates that the conductor film 19 formed on the projection 17a improves the upper surface roughness and increases the chucking force of the projection 17a. That is, the conductor film 19 does not decrease the chucking force by its thickness, but has the effect of increasing the chucking force.

The present inventor has found from the experimental results that the chucking force remains unchanged even when the conductor films 19 are formed on the projections 17a, so the electrostatic chuck 8 of the present invention achieves the chucking force even with the projections 17a. The conductor film 19 presumably increases the chucking force by improving the upper surface roughness of the projection 17a (i.e., shortening the practical distance between the substrate 9 and the conductor film 19 on the top surface of the projection 17a). In addition, the substrate 9 and conductor films 19 have many contact points. This perhaps makes it possible to move the electric charge near the contact points toward the electrostatic chuck 8 when the external power supply 16 is turned off.

A graph shown in FIG. 8 indicates the effect of improving separation, as the effect of the present invention, and explains the states of separation when the conductor film 19 is formed on the top surface of the projection 17a and no conductor film 19 is formed.

In this experiment, a monopolar electrostatic chuck 8 was used, and a 300-mm silicon wafer having a lower surface covered with silicon nitride was used as the substrate 9. A reverse voltage was applied to the electrostatic chuck 8 for a predetermined time immediately before the external power supply 16 was turned off, and the time before the substrate 9 was separated was measured.

When no conductor film 19 was formed, the separation time shortened as the reverse voltage was increased to 150 V, but a separation time of about 5 sec was necessary even when a reverse voltage of 150 V or more was applied. On the other hand, when the conductor film 19 was formed, it was possible to separate the substrate 9 immediately after the external power supply 16 was turned off regardless of the condition. Also, easy separation was observed even at 20° C. to −30° C. at which the volume resistivity increases. As described earlier, this demonstrates that the residual electric charge, which had a large influence on chucking, of the projection 17a rapidly reduced, that is, charge removal was rapidly performed.

As described above, the electrostatic chuck of the present invention controls the residual electric charge on the embossed projection of a Johnson-Rahpeck type electrostatic chuck using a dielectric material having an appropriately low volume resistivity, and is applicable to both a monopolar chuck and bipolar chuck. The electrostatic chuck can be applied not only to a sputtering apparatus but also to a CVD apparatus for depositing a thin film on a substrate or an etching apparatus for processing a thin film. Furthermore, since the electrostatic chuck has an effect on the separation of a substrate covered with a high-k silicon nitride film, the electrostatic chuck is also applicable to a substrate, such as a glass substrate, made of a material having a high-k upper surface, as well as a silicon substrate.

The preferred embodiments of the present invention have been explained above with reference to the accompanying drawings. However, the present invention is not limited to these embodiments and can be changed into various forms within the technical scope grasped from the description of the scope of the appended claims.

The present invention is not limited to the above embodiment and various changes and modifications can be made without departing from the spirit and scope of the invention. Therefore, to apprise the public of the scope of the present invention, the following claims are appended.

This application claims the benefit of Japanese Patent Application No. 2007-234968, filed Sep. 11, 2007, which is hereby incorporated by reference herein in its entirety.

The invention claimed is:

1. An electrostatic chuck comprising a dielectric board having an upper surface on which a plurality of projections for supporting a substrate on top surfaces and recesses surrounding the projections are formed, and an electrode which is formed inside said dielectric board and receives a voltage from an external power supply,
wherein said dielectric board includes a conductor film formed on the top surface of each projection, and
each of the top surfaces of the projections having said conductor film have a three-dimensional structure whose Ry (maximum surface roughness) is not more than 2.5 μm and Ra (central line average roughness) is not more than 0.25 μm,
said conductor film formed on the to surface of each projection is electrically isolated from the conductor film on other of the to surfaces, and
said conductor film is not formed in each of the recesses.

2. The electrostatic chuck according to claim 1, wherein a resistivity of said conductor film is not more than 350 μΩ·cm.

3. The electrostatic chuck according to claim 1, wherein said conductor film is a film made of a material selected from the group consisting of titanium and tungsten.

4. The electrostatic chuck according to claim 1, wherein said conductor film includes a first layer which is a film made of a material selected from the group consisting of titanium and tungsten, and a second layer formed on said first layer and made of one of a nitride and an oxide of a material selected from the group consisting of titanium and tungsten.

5. The electrostatic chuck according to claim 1, wherein the top surfaces of the projections each having said conductor film have a three-dimensional structure whose Ry (maximum surface roughness) is not less than 0.2 μm and not more than 2.5 μm and Ra (central line average roughness) is not less than 0.02 μm and not more than 0.25 μm.

6. The electrostatic chuck according to claim 1, wherein said conductor film is made of one material selected from the group consisting of a metal as an electrical conductor having a resistivity of not more than 10 $E^{-4}$ μΩ·cm, a metal oxide, and a metal nitride.

7. The electrostatic chuck according to claim 1, wherein the plurality of projections for supporting a substrate on the top surfaces are columns having a diameter of not more than 0.7 mm.

8. The electrostatic chuck according to claim 1, wherein the plurality of projections for supporting a substrate on the top surfaces are formed such that a height is not more than 15 μm, and a total area of the top surfaces is 1% to 2% of an overall planar area of said dielectric board.

9. The electrostatic chuck according to claim 1, wherein a thickness of said conductor film is not more than 1.5 μm.

10. The electrostatic chuck according to claim 1, wherein the plurality of projections for supporting a substrate on the top surfaces are columns having a diameter of 0.4 mm±0.15 mm and a height of 8.5 μm±2 μm.

11. An electrostatic chuck comprising a dielectric board having an upper surface on which a plurality of projections for supporting a substrate on top surfaces and recesses surrounding the projections are formed, and an electrode which is formed inside said dielectric board and receives a voltage from an external power supply, wherein said dielectric board includes a conductor film formed on the top surface and circumferential surface of each of the projections, the top surfaces of the projections each having said conductor film having a three-dimensional structure whose Ry (maximum surface roughness) is not more than 2.5 μm, said conductor film formed on the top surface and circumferential surface of each projection is electrically isolated from the conductor film on other of the projections, and said conductor film is not formed in each of the recesses.

12. The electrostatic chuck according to claim 11, wherein the top surfaces of the projections each having said conductor film have a three-dimensional structure whose Ry (maximum surface roughness) is not less than 0.2 μm.

13. The electrostatic chuck according to claim 11, wherein the top surfaces of the projections each having said conductor film have a three-dimensional structure whose Ra (central line average roughness) is not less than 0.02 μm and not more than 0.25 μm.

14. The electrostatic chuck according to claim 12, wherein the top surfaces of the projections each having said conductor film have a three-dimensional structure whose Ra (central line average roughness) is not less than 0.02 μm and not more than 0.25 μm.

* * * * *